US006812531B1

(12) United States Patent
Baldi et al.

(10) Patent No.: US 6,812,531 B1
(45) Date of Patent: *Nov. 2, 2004

(54) MATRIX OF MEMORY CELLS FABRICATED BY MEANS OF A SELF-ALIGNED SOURCE PROCESS, COMPRISING ROM MEMORY CELLS, AND RELATED MANUFACTURING PROCESS

(75) Inventors: Livio Baldi, Agrate Brianza (IT); Paolo Ghezzi, Rivolta D'Adda (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,055

(22) Filed: Apr. 30, 1999

(30) Foreign Application Priority Data

May 11, 1998 (EP) .............................................. 98830282

(51) Int. Cl.$^7$ ........................... H01L 29/76; H01L 29/94
(52) U.S. Cl. ....................................... 257/390; 257/391
(58) Field of Search ................................ 257/390, 391, 257/910, 315, 316, 319; 438/128, 129, 130, 275, 278, 290

(56) References Cited

U.S. PATENT DOCUMENTS

| 4,107,719 A | | 8/1978 | Graul et al. ................... 357/15 |
| 4,282,646 A | | 8/1981 | Fortino et al. ................. 29/571 |
| 4,357,178 A | | 11/1982 | Bergeron et al. ............. 148/1.5 |
| 4,514,894 A | * | 5/1985 | Kawagoe ..................... 257/276 |
| 4,535,532 A | | 8/1985 | Lancaster ..................... 29/576 |
| 4,597,060 A | | 6/1986 | Mitchell et al. ............. 365/185 |
| 4,792,925 A | | 12/1988 | Corda et al. ................. 365/185 |
| 4,905,062 A | | 2/1990 | Esquivel et al. ........... 357/23.5 |
| 5,087,584 A | | 2/1992 | Wada et al. ................... 437/43 |

(List continued on next page.)

FOREIGN PATENT DOCUMENTS

| DE | 35 392 34 A1 | 5/1986 |
| EP | 0 213 983 A3 | 3/1987 |
| EP | 0 575 688 A2 | 12/1993 |

OTHER PUBLICATIONS

Ohshima et al., "Process and Device Technologies for 16Mbit EPROMs with Large-Tilt-Angle Implanted P-Pocket Cell," *IEEE*, IEDM 90-95, Ch. 2865 (1990), pp. 5.2.1-5.2.4.

(List continued on next page.)

*Primary Examiner*—Hung Vu
(74) *Attorney, Agent, or Firm*—Lisa K. Jorgenson; James H. Morris; Wolf, Greenfield & Sacks, P.C.

(57) ABSTRACT

Matrix of memory cells formed using a method allowing for a self-alignment of the respective source region with the respective field oxide layer and the respective overlying polysilicon layer of each single cell of the matrix, the matrix including at least one first ROM memory cell suitable for permanently storing a first logic level, associated with a respective row and a respective column of the matrix, the first cell including a silicon substrate of a first conductivity type over which a first isolation region and a second isolation region are formed delimiting therebetween a longitudinal stripe, a gate element extending transversally through the stripe from at least one side of the first isolation region to at least one side of the second isolation region, a third region of a second conductivity type and a fourth region of a second conductivity type formed in the substrate along the stripe, and a field oxide region adapted to prevent the formation of a conductive channel in the substrate, and at least a second ROM cell for permanently storing a second logic level, identical to the first ROM memory cell but not provided with the field oxide region.

27 Claims, 5 Drawing Sheets

U.S. PATENT DOCUMENTS

| | | | | |
|---|---|---|---|---|
| 5,103,274 A | | 4/1992 | Tang et al. | 257/401 |
| 5,160,986 A | | 11/1992 | Bellezza | 257/316 |
| 5,200,802 A | * | 4/1993 | Miller | 257/390 |
| 5,256,584 A | | 10/1993 | Hartmann | 437/43 |
| 5,296,396 A | | 3/1994 | Bellezza | 437/43 |
| 5,330,924 A | | 7/1994 | Huang et al. | 437/43 |
| 5,376,566 A | | 12/1994 | Gonzalez | 437/35 |
| 5,378,641 A | | 1/1995 | Cheffings | 437/35 |
| 5,403,764 A | | 4/1995 | Yamamoto et al. | 438/257 |
| 5,407,852 A | | 4/1995 | Ghio et al. | 438/130 |
| 5,426,063 A | | 6/1995 | Kaneko et al. | 437/35 |
| 5,432,749 A | | 7/1995 | Sethi | 365/218 |
| 5,453,637 A | | 9/1995 | Fong-Chun et al. | 257/390 |
| 5,459,085 A | | 10/1995 | Pasen et al. | 437/35 |
| 5,475,250 A | | 12/1995 | Bellezza | 257/316 |
| 5,480,823 A | | 1/1996 | Hsu | 438/275 |
| 5,482,881 A | | 1/1996 | Chen et al. | 437/43 |
| 5,593,907 A | | 1/1997 | Anjum et al. | 437/35 |
| 5,624,859 A | | 4/1997 | Liu et al. | 438/298 |
| 5,670,392 A | | 9/1997 | Ferla et al. | 437/29 |
| 5,698,879 A | | 12/1997 | Aritome et al. | 257/315 |
| 5,723,351 A | | 3/1998 | Bellezza | 437/43 |
| 5,736,421 A | * | 4/1998 | Shimomura et al. | 438/253 |
| 5,793,086 A | | 8/1998 | Ghio et al. | 257/390 |
| 5,814,853 A | * | 9/1998 | Chen | 257/315 |
| 5,894,065 A | | 4/1999 | Brambilla et al. | 438/265 |

OTHER PUBLICATIONS

Patent Abstracts of Japan, vol. 017, No. 334 (E–1387), Jun. 24, 1993 & JP 05 041385 A, Feb. 19, 1993, "Semiconductor Device and Manufacture Thereof," Mitsubishi Electric Corp.

Patent Abstracts of Japan, vol. 96, No. 7, Jul. 31, 1996, JP 08 078681 A , Mar. 22, 1996, "Manufacture of Semiconductor Device," Ricoh Co., Ltd.

Patent Abstracts of Japan, vol. 95 No. 009, Oct. 31, 1995 & JP 07 147327, Jun. 6, 1995, "Semiconducter Device and its Manufacture," Sony Corp.

Patent Abstracts of Japan, vol. 013, No. 490 (E–841), Nov. 7, 1989 & JP 01 196121, Aug. 7, 1989, "Manufacture of Semiconducter Device," Matsushita ELectron Corp.

Patent Abstracts of Japan, vol. 8, No. 221 (E–271), Oct. 9, 1984 & JP 59 103368, Jun. 14, 1984, "Semiconductor Device," Fujitsu K.K.

Wolf et al., "Silicon Processing for the VLSI Era," 1986, pp. 292–293, Lattice Press, California.

Ghandi, "VLSI Fabrication Principles," 1994, pp. 731–734, John Wiley & Sons, Inc., New York.

European Search Report from European Patent Application No. 96830362, Nov. 29, 1996.

European Search Report from European Patent Application No. 98830388, filed Jun. 30, 1996.

European Search Report from European Patent Application No. 96830086, filed Jun. 30, 1996.

French Search Report from French Patent Application 95 09328, filed Apr. 24, 1996.

European Search Report from European Patent Application 98830282.4, filed May 11, 1998.

* cited by examiner

MATRIX OF MEMORY CELLS FABRICATED BY MEANS OF A SELF-ALIGNED SOURCE PROCESS, COMPRISING ROM MEMORY CELLS, AND RELATED MANUFACTURING PROCESS

BACKGROUND OF THE INVENTION

1. Field of the Invention

The present invention concerns the integration of one or more ROM (Read Only Memory) memory cells in a matrix of electrically programmable non-volatile memory cells, said matrix formed using of a Self-Aligned Source (SAS) process.

2. Discussion of the Related Art

Several devices include matrices of programmable non-volatile memory cells, typically EPROM, EEPROM or Flash EEPROM memory cells. Such devices are for example stand-alone memories, or microcontrollers with an embedded non-volatile memory. It can be necessary to include ROM memory cells in the matrix of electrically programmable memory cells. The ROM portion of the matrix is used for permanently storing parts of a program or codes which are not to be modified by the user.

ROM memory cells are normally formed by transistors whose "1" or "0" logic content is programmed "hardware" during the manufacturing process, so that the content cannot be electrically altered.

Conventionally, a ROM memory cell is formed by a MOS transistor, e.g. an N-channel one, having N type drain region and source region formed spaced-apart in a P type substrate or well. The substrate portion between the drain and source regions forms a channel region, and a gate electrode is superimposed over the channel region by the interposition of a thin gate oxide layer.

Typical methods used for setting the logic content in a MOS transistor during the manufacturing process are:

1. Active area programming: in FIG. 1 there is schematically shown a top-plan view of some ROM memory cells arranged in rows and columns to form the matrix structure of a semiconductor memory device. There is shown an N+ common source line 1, N+ drain regions 4 formed using implantation and diffusion, two polysilicon word lines 2, typically formed using a lithographic process, which run parallel to the common source line and correspond to the gate regions of the cells, and some field oxide regions 3, defined in an early process step by means of a conventional selective thermal oxidation ("LOCOS"). The field oxide regions 3 bound the active areas of the device. The low logic level ("0") (cell 6 in FIG. 1) is obtained by interrupting the electrical connection of the active area, using a suitable layout of the photolithographic mask used for defining the active area. A suitable dimension d for the interruption of the active area must be respected to assure that the electrical connection is effectively interrupted. In this way, a memory cell 6 is obtained including a MOS transistor whose gate oxide is the thick field oxide. This MOS transistor thus has a threshold voltage much higher than a conventional MOS transistor, and additionally the source and the drain are spaced apart from the gate electrode (word line 2). The high logic state ("1") is achieved by forming a conventional MOS transistor 5. Programming the memory cells is thus performed at the level of the mask for forming the active areas of the memory device, and no further masks are required.

2. Programming by P-LDD doping: similarly to FIG. 1, FIG. 2 schematically shows a top-plan view of some cells of a semiconductor memory device. For programming the low logic state ("0") in the memory cell 7, a P-LDD mask 8 is used. Since ROM memory cells are typically formed by N-channel MOS transistors, the LDD implant for P-channel MOSFETs is used for counterdoping by a P type dopant the LDD region of the N-channel transistor. Opening the P-LDD mask 8 over the N-channel MOSFET forming the memory cell 7, a transistor is obtained with detached junctions. In such a way the electrical connection between source and drain is interrupted and the transistor cannot be driven by biasing the gate. A memory cell storing the low logic state is thus obtained. The high logic level ("1") is obtained as usual by forming a conventional transistor. Also in this case, programming of a cell is done by modifying one mask, during the manufacturing of the device, without the necessity of additional masks.

3. Programming using threshold-voltage regulation implant: the low logic state can be achieved by using a suitable P type doping, used for regulating the threshold voltage of the N-channel MOS transistor forming the cell to be programmed. The doping affects the channel of the transistor. Such a method is for example described in U.S. Pat. No. 5,403,764. In this way it is possible to obtain transistors with as high a threshold voltage as desired. A drawback is that the breakdown voltage of the drain junction is lowered, due to the increased dopant concentration gradient between the drain junction and the channel. Furthermore, an additional mask is required for the formation of transistors storing the low logic level, i.e., having a high threshold voltage.

The demand for semiconductor memory devices with high-density memory matrices has made it necessary to reduce the size of the elementary memory cells. One of the techniques allowing such a reduction is the Self Aligned Source (SAS) process, described for example in U.S. Pat. No. 5,103,274. The difference between a SAS process and a conventional, non-SAS process is in the layout of the active area 9 in the matrix which, as shown in FIGS. 3 and 4, has no distinctions between the source and drain regions. In FIGS. 3 and 4, some memory cells of a matrix of a semiconductor memory device are shown: in FIG. 3 the active area 9 of a non-SAS matrix has the conventional T shape. In FIG. 4 the active area of a SAS matrix is shown, at a step preceding the SAS etching by means of the SAS mask: the typical stripe layout of the active area is visible. Subsequently, the field oxide regions 3 are completely removed from the stripe included between the two word lines 2.

By means of the SAS process a memory device is obtained having the edges of the field oxide regions vertically aligned to the polysilicon word lines. The source regions, formed between the edges of the field oxide regions of adjacent cells, are thus self-aligned to both the field oxide regions and the word lines.

The self-alignment of the source regions allows a closer distribution of the polysilicon word lines, without any decrease in the source width. Thus, a lower distance between one memory cell and the adjacent one is required. The size of the elementary memory cell is thus reduced, and a higher density of the overall device can be achieved.

The conventional, non-SAS technique is not practicable for devices requiring a high capacity, since the area of the memory could impact significantly the physical dimensions of the device, making it inconvenient to be industrially produced.

On the other hand, forming ROM memory cells using the method of programming by P-LDD doping (point 2 above) or using the method of programming by ion implantation into the channel for regulating the threshold voltage (point 3 above) have the following shortcomings:

they require the use of an additional mask, as well as additional process steps;

they produce a lowering of the breakdown voltage of the drain junction, not compatible with the operating voltages of the EPROM or Flash EEPROM devices wherein the ROM memory cell is integrated as a portion of the matrix.

In view of the state of the art described, the present invention provides a semiconductor memory device comprising ROM memory cells inside a matrix of memory cells formed by means of a Self-Aligned Source process, without incurring in the above-mentioned drawbacks.

SUMMARY OF THE INVENTION

According to the present invention, this and other advantages are achieved by a matrix of memory cells formed using a method allowing for a self-alignment of the respective source region with the respective field oxide layer and the respective overlying polysilicon layer of each single cell of the matrix, comprising at least one first ROM memory cell suitable for permanently storing a first logic level, associated with a respective row and a respective column of the matrix, said first cell comprising a silicon substrate of a first conductivity type over which a first and a second isolation region are formed, delimiting therebetween a longitudinal stripe, a gate element extending transversally through the stripe from at least one side of the first isolation region to at least one side of the second isolation region, a third region of a second conductivity type and a fourth region of a second conductivity type formed in the substrate along the stripe, and means adapted to prevent the formation of a conductive channel in the substrate, and at least a second ROM cell for permanently storing a second logic level, identical to the first ROM memory cell but not provided with said means.

Still according to the present invention, there is provided a process for manufacturing a matrix of memory cells, comprising a first step of definition of first, parallel active area stripes delimited by field oxide regions, a second step of definition of rows of the matrix extending transversally to the stripes, a third step of removal of the field oxide regions between pairs of alternated rows for obtaining, between said pairs of alternated rows, second stripes of exposed substrate, delimited by adjacent edges of the rows of said pairs, a fourth step of implantation for the formation of source and drain regions, wherein, in the first step, there is provided a layout of the mask for the definition of the active area suitable to allow the presence of oxide regions in the areas wherein ROM memory cells are provided suitable for permanently storing the first logic level.

The process according to the invention allows for integrating ROM memory cells in a matrix of electrically programmable memory cells formed according to the SAS method. Additionally, the process according to the invention allows switching from the production of an EPROM or Flash EEPROM version of a device to a ROM version of the device, with minimum process changes and leaves most of the masks unchanged.

BRIEF DESCRIPTION OF THE DRAWINGS

The features and advantages of the invention will be made apparent by the following detailed description of one embodiment thereof, illustrated as a non-limiting example in the annexed drawings, wherein.

DETAILED DESCRIPTION

Figure 1:
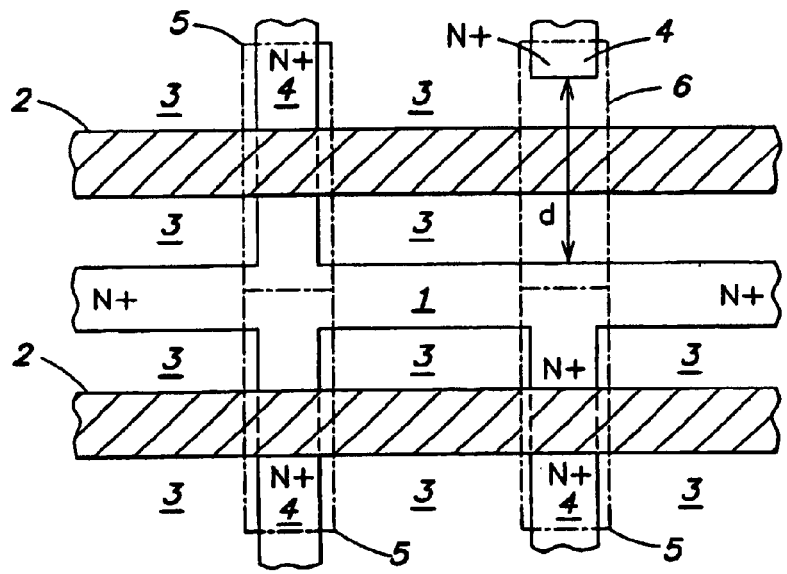
FIG. 1 schematically shows in top-plan view some ROM memory cells arranged in rows and columns in a matrix structure, in a semiconductor memory device wherein the ROM memory cells are programmed using the active area layout.
Figure 2:
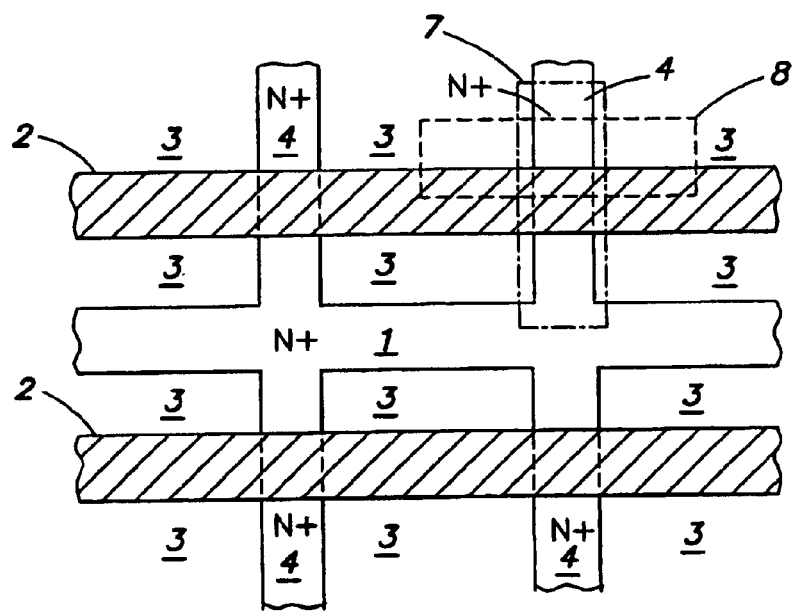
FIG. 2 schematically shows in top-plan view some ROM memory cells arranged in rows and columns in a matrix structure, in a semiconductor memory device wherein the ROM memory cells are programmed using a P-LDD mask.
Figure 3:
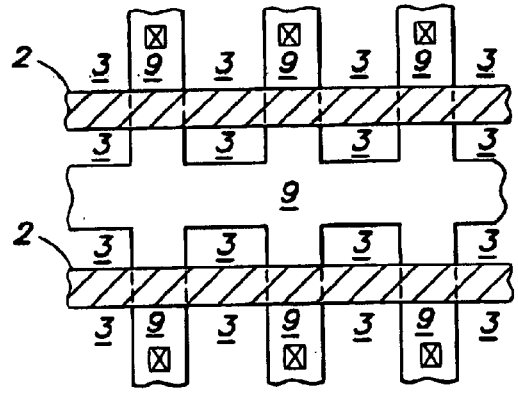
FIG. 3 schematically shows a matrix of memory cells formed using a conventional, non-SAS process.
Figure 4:
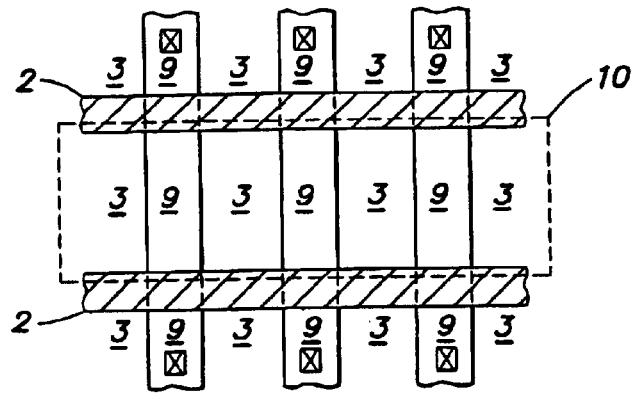
FIG. 4 schematically shows the active area layout of a matrix of memory cells in the case of a SAS process, at a step preceding the Self-Aligned Source etching.
Figure 5:
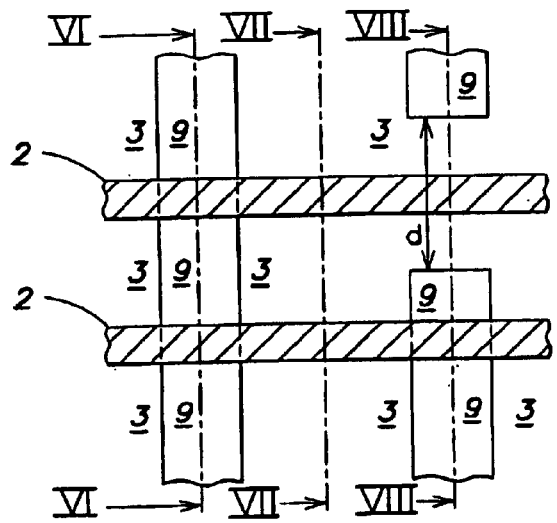
FIG. 5 schematically shows in top-plan view some ROM memory cells arranged in rows and columns in a matrix structure in the step of definition of the layout of the active area, in one embodiment of the present invention.
Figure 9:
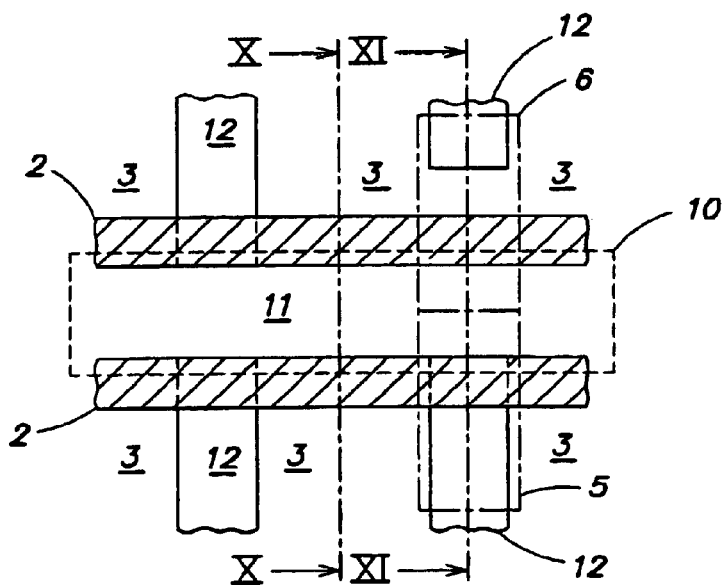
FIG. 9 schematically shows, in top-plan view, some ROM memory cells arranged in rows and columns in a matrix structure according to an embodiment of the present invention.

Referring to FIG. 5, it can be noted that the mask for the definition of the active area is interrupted in a zone of the matrix wherein it is desired to permanently program, in a ROM cell, a low logic level. Thanks to the subsequent application of the SAS mask, as will be described later, that assures the electrical continuity of the source line, the dimension d is more than sufficient, since all the area comprised between the two word lines is available. The active area has the typical stripe shape, with interposed field oxide regions which subsequently, using the SAS mask, will be chemically etched so as to form the common source active region, as shown in FIG. 9.

Figure 6:
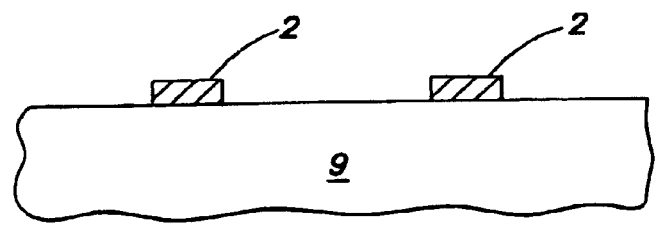
FIG. 6 schematically shows a cross-section along line VI—VI in FIG. 5.

FIG. 6 shows the transverse cross-section along line VI—VI depicted in FIG. 5, wherein the two word lines 2 are shown. The two word lines 2, located over the active area substrate 9, form the gate of the ROM memory cells storing the high logic level.

Figure 7:
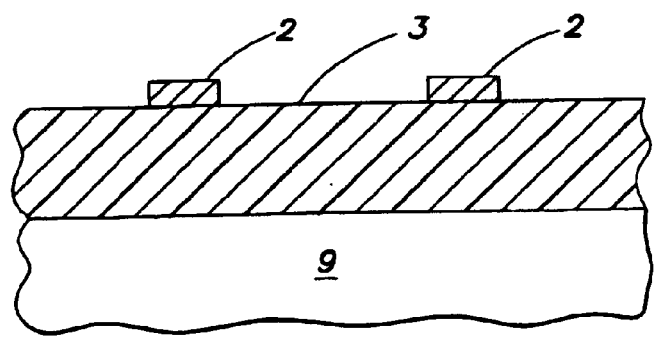
FIG. 7 schematically shows a cross-section along line VII—VII in FIG. 5.

FIG. 7 shows the transverse cross-section along line VII—VII in FIG. 5. It can be noted that between two the word lines 2 and the active area 9 there is interposed a thick field oxide layer 3 suitable for isolating the two word lines.

Figure 8:
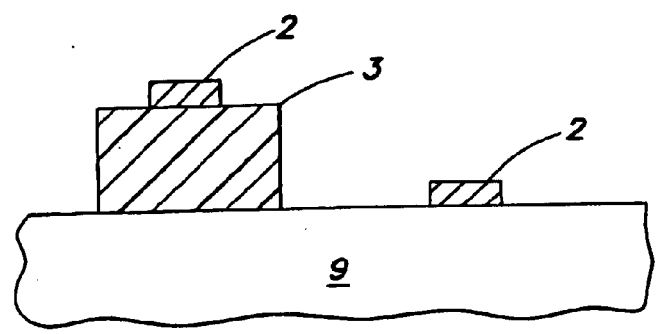
FIG. 8 schematically shows a cross-section along line VIII—VIII in FIG. 5.

FIG. 8 schematically shows the cross-section along line VIII—VIII in FIG. 5: it is possible to note the differences in the layout of the active area, differences which are suitable to define the two ROM memory cells storing different logic levels.

FIG. 9 schematically shows, in top-plan view, the same ROM memory cells shown in FIG. 5, after the application of the SAS mask 10 and the subsequent, highly selective etch of the field oxide present in the area between the two word lines 2, so as to allow a subsequent source and drain implantation for the formation of the common source region 11 and the drain regions 12. In this way, it is possible to obtain ROM memory cells using the SAS process, i.e. with the vertical self-alignment of the source region 11 to the word lines 2 and the field oxide 3. Thanks to the above-mentioned interruption in the active area layout, a ROM memory cell is permanently programmed in a low logic state, while the others are permanently programmed in a high logic state.

Figure 10:
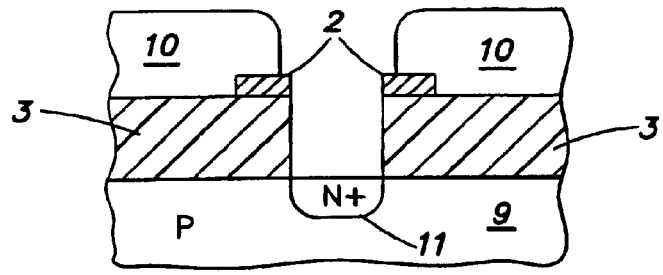
FIG. 10 schematically shows the cross-section along line X—X in FIG. 9.

FIG. 10 is a transverse cross-section along line X—X in FIG. 9. It can be noted the vertical alignment typical of the SAS technique, a consequence of the use of the SAS mask 10 and the chemical etching of the field oxide 3.

Figure 11:
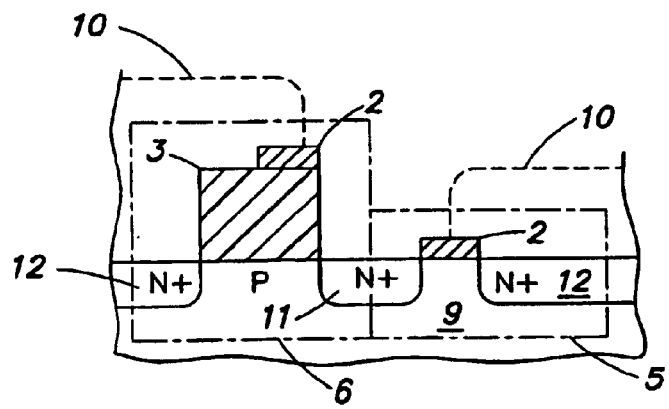
FIG. 11 schematically shows the cross-section along line XI—XI in FIG. 9.
Figure 12:
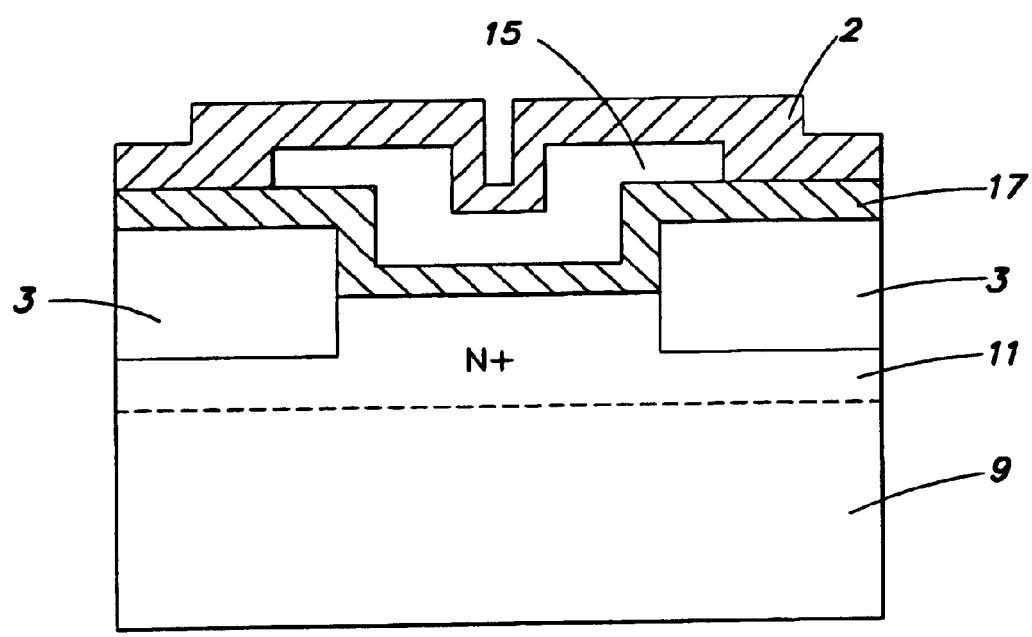
FIG. 12 is a horizontal cross-section of one cell of the upper word line in FIG. 9, in the case of an embodiment with a double level of polysilicon in the ROM.

In FIG. 11, which is a cross-section along line XI—XI in FIG. 9, it is possible to note the different structure of two ROM cells storing different logic levels: the one storing a low logic level has a thick field oxide layer interposed between its gate (i.e., the corresponding word line) and the active area substrate. No conductive channel can form in the active area substrate under the gate. Differently, in the cell storing the high logic level such a field oxide layer 3 is not present, and a conductive channel can form between the common source region 11 and the drain region 12.

Where only a portion of the EPROM or Flash EEPROM matrix is converted into a ROM matrix, it can be advantageous to keep the double level of polysilicon also in the ROM portion of the matrix. In this case, as seen in FIG. 12, in the ROM portion of the matrix, no interruptions in the polysilicon layer forming the floating gate are provided and the two polysilicon layers 2 and 17 are short-circuited at the periphery, removing the isolation dielectric 15 therebetween using the mask already provided in the process for the fabrication of EPROMs or Flash EEPROMs.

One advantage of the invention resides in the fact that the ROM portion of the matrix can be obtained without additional masks and process steps, and allows the layout rules of the electrically programmable portion of the matrix to be respected. It is thus possible to integrate, in the same matrix, programmable non-volatile memory cells, such as EPROM, Flash EEPROM or EEPROM cells, and ROM memory cells, without introducing irregularities in the matrix.

Another advantage of the present invention is the possibility to switch from an EPROM or Flash EEPROM memory device to an equivalent device in ROM version, with minimum changes to the manufacturing process and keeping the same masks. In this case, the process can even be simplified, and a single polysilicon level process can be used instead of a double polysilicon level process.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Matrix of memory cells for storing two logic levels, comprising:
   at least one first-type ROM memory cell fabricated to permanently store a first logic level and at least one second-type ROM memory cell fabricated to permanently store a second logic level, said first-type and second-type cells comprising a silicon substrate of a first conductivity type over which a first isolation region and a second isolation region are formed delimiting therebetween a longitudinal stripe including source and drain lines of a second conductivity type formed in the substrate, and each cell having a gate element formed over the substrate and each cell having extending transversally across the stripe from at least one side of the first isolation region to at least one side of the second isolation region, said source line being self-aligned with respect to and extending at least from one said gate element to another said gate element thereby forming two said memory cells with respect to two said drain lines, said first-type ROM memory cell including an insulating region located between the substrate and said gate element and arranged to permanently prevent formation of a conductive channel in the substrate between said self-aligned source line and said drain line of said first-type memory cells, said source line being self-aligned by including a self aligned source (SAS) mask to enable removal of the insulating region over said source line.

2. Matrix according to claim 1, wherein said insulating region located between the substrate and said gate element includes a field oxide region.

3. Matrix according to claim 1, wherein said first conductivity type is P type, and said second conductivity type is N type.

4. Matrix according to claim 1, wherein said gate element comprises polysilicon.

5. Matrix according to claim 1, wherein said first isolation region and said second isolation region comprise field oxide regions.

6. Matrix according to claim 1, wherein said gate elements form a word line.

7. Matrix according to claim 1, wherein said gate elements include two polysilicon layers short-circuited at a periphery of said array.

8. Matrix according to claim 1, wherein said memory cells include non-volatile memory cells.

9. Matrix according to claim 8, wherein said non-volatile memory cells include EPROM memory cells.

10. Matrix according to claim 8, wherein said non-volatile memory cells include EEPROM memory cells.

11. Matrix according to claim 8, wherein said non-volatile memory cells include flash EEPROM memory cells.

12. Matrix according to claim 1, wherein the source line is self-aligned with the gate element in both memory cells.

13. A device including an array of memory cells, comprising:
   an array of memory cells fabricated on a semiconductor substrate and separated by a patterned insulating layer and including first and second lines of a first conductivity type formed in the substrate having a second conductivity type region between said first and second lines, and gate regions arranged between said first and second lines,
   at least two parallel word lines disposed at said gate regions between said first lines and said second lines;
   a first-type ROM memory cell fabricated to permanently store a high logic level and a second-type ROM memory cell fabricated to permanently store a low logic level, arranged to include one said first line centrally disposed between two said second lines forming two said ROM memory cells;

said first line of said first-type and second-type ROM memory cells being self-aligned with the use of a self aligned source (SAS) mask and thus extending at least from one said word line of said first-type ROM memory cell to next said word line of said second-type ROM memory cell; and said second-type ROM memory cell including an insulating region, at said gate region, disposed between said word line and the substrate and being arranged to permanently prevent formation of a conductive channel from said self-aligned first line to said second line.

14. The device of claim 13 wherein said first conductivity type is N type, and said second conductivity type is P type.

15. The device of claim 13 wherein said substrate is a silicon wafer.

16. The device of claim 13 wherein said first line is a source line and said second line is a drain line.

17. The device of claim 16, wherein said SAS mask enables removal of the insulating region over the source line so as to provide self alignment of the source line to the word lines and the insulating region.

18. The device of claim 12 wherein said source lines form a continuous source line arranged in parallel with said word lines.

19. The device of claim 18 wherein said word line includes a polysilicon layer.

20. The device of claim 13 wherein said patterned insulating layer includes a field oxide.

21. The device of claim 13 wherein said insulating region disposed between said word line and the substrate includes a field oxide.

22. A memory device, comprising:

an array of non-volatile memory cells and ROM memory cells fabricated on a semiconductor substrate and separated by a patterned insulating layer and including first and second lines of a first conductivity type formed in the substrate having a second conductivity type region between said first and second lines, and gate regions arranged between said first and second lines, at least two parallel word lines disposed at said gate regions between said first lines and said second lines;

a first-type ROM memory cell fabricated to permanently store a high logic level and a second-type ROM memory cell fabricated to permanently store a low logic level, arranged to include one said first line centrally disposed between two said second lines forming two said ROM memory cells;

said first line of said first-type and second-type ROM memory cells being self-aligned with the use of a self aligned source (SAS) mask and thus extending at least from one said word line of said first-type ROM memory cell to next said word line of said second-type ROM memory cell; and said second-type ROM memory cell including an insulating region, at said gate region, disposed between said word line and the substrate and being arranged to permanently prevent formation of a conductive channel from said self-aligned first line to said second line.

23. The device of claim 22 wherein said non-volatile memory cells include EPROM memory cells.

24. The device of claim 22 wherein said array of memory cells include EEPROM memory cells.

25. The device of claim 22 wherein said array of memory cells include flash EEPROM memory cells.

26. The device of claim 22 wherein, in said ROM memory cells, said gate regions and said word lines includes two polysilicon layers that are short-circuited.

27. The device of claim 22, wherein said first line is a source line and said second line is a drain line and wherein said SAS mask enables removal of the insulating region over the source line so as to provide self alignment of the source line to the word lines and the insulating region.

* * * * *